(12) United States Patent
Guo et al.

(10) Patent No.: US 8,757,357 B2
(45) Date of Patent: Jun. 24, 2014

(54) ALIGNING APPARATUS AND METHOD FOR GLASS SUBSTRATE

(71) Applicant: Shenzhen China Star Optoelectronics Technology Co., Ltd., Guangdong (CN)

(72) Inventors: Zhenhua Guo, Shenzhen (CN); Chunhao Wu, Shenzhen (CN); Kunhsien Lin, Shenzhen (CN); Yongqiang Wang, Shenzhen (CN); Weibing Yang, Shenzhen (CN); Yunshao Jiang, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 13/703,692

(22) PCT Filed: Nov. 15, 2012

(86) PCT No.: PCT/CN2012/084710
§ 371 (c)(1),
(2), (4) Date: Dec. 12, 2012

(87) PCT Pub. No.: WO2014/075278
PCT Pub. Date: May 22, 2014

(65) Prior Publication Data
US 2014/0131168 A1 May 15, 2014

(30) Foreign Application Priority Data
Nov. 13, 2012 (CN) .......................... 2012 1 0452874

(51) Int. Cl.
*B65G 47/24* (2006.01)

(52) U.S. Cl.
USPC .... 198/413; 198/345.1; 198/375; 198/370.07

(58) Field of Classification Search
USPC ................. 198/340, 341.05, 345.1, 375, 376, 198/370.07, 413; 193/35 C
See application file for complete search history.

(56) References Cited

U.S. PATENT DOCUMENTS

| | | | | |
|---|---|---|---|---|
| 5,028,202 A | * | 7/1991 | Katada et al. | 414/783 |
| 5,135,098 A | * | 8/1992 | Koibuchi | 198/345.1 |
| 5,293,984 A | * | 3/1994 | Lucas | 198/414 |
| 5,413,204 A | * | 5/1995 | Mori et al. | 198/345.1 |
| 5,927,469 A | * | 7/1999 | Dunifon et al. | 198/456 |
| 6,698,159 B2 | * | 3/2004 | Harris et al. | 83/247 |
| 7,376,486 B2 | * | 5/2008 | Kuribara et al. | 700/213 |
| 7,712,334 B2 | * | 5/2010 | Kanno et al. | 65/29.11 |
| 8,360,227 B2 | * | 1/2013 | Niewiera | 198/373 |

* cited by examiner

*Primary Examiner* — Douglas Hess
(74) *Attorney, Agent, or Firm* — Andrew C. Cheng

(57) ABSTRACT

The present invention provides an aligning apparatus for glass substrate to properly align the glass substrate during transfer along a conveyor. The aligning apparatus includes a plurality of rollers, at least a pair of directional beams, at least a pair of positioning devices, a piston, and a detecting device. The detecting device is used to detect whether there is an offset of the glass substrate during the transportation, and the piston will be triggered once an offset is found and determined. The piston will move the positioning device such that a portion of the positioning device which extends to the roller will push the offset glass substrate so as to bring the glass substrate back to the correct position. The present invention also discloses a method to conduct the alignment of the glass substrate. By the disclosure of the present invention, the glass substrate transferred on the rollers can be automatically adjusted and aligned once an offset is found.

9 Claims, 2 Drawing Sheets

ALIGNING APPARATUS AND METHOD FOR GLASS SUBSTRATE

CROSS REFERENCE

This application is claiming a priority arisen from a patent application, entitled with "Aligning Apparatus and Method for Glass Substrate", submitted to China Patent Office on Nov. 13, 2012, designated with an Application Number 201210452874.1. The whole and complete disclosure of such patent application is hereby incorporated by reference.

FIELD OF THE INVENTION

The present invention relates to the technical field of manufacturing liquid crystal display panel, and more particularly, to an aligning apparatus and method for glass substrate.

DESCRIPTION OF PRIOR ART

Manufacturing of the Thin Film Transistor Liquid Crystal Display (TFT-LCD) is known to a complicated process, the glass substrate has to be aligned occasionally from stations to stations. Specially, the handling equipments are different from stations to stations, the true position of the glass substrate on the handling vehicles could be altered, and therefore an alignment is needed.

When the glass substrate is transferred by conveyer or other available equipment, the glass substrate tends to offset during the movement. Once the glass substrate is offset from its intended and true position, the glass substrate could be easily damaged, and therefore lower the quality of the glass substrate. As a result, the glass substrate has to be aligned frequently during the movement, and currently it is performed manually, taking time, and reducing yield.

SUMMARY OF THE INVENTION

It is an object of the present invention to provide a technical solution to address the problem encountered by the prior art, and an aligning apparatus and method is introduced, and which can conduct the alignment of a glass substrate automatically once the glass substrate is found offset.

In order to resolve the problem encountered by the prior art, the present invention provides an aligning apparatus to correct a misalignment or offset of a glass substrate during the transportation. The aligning apparatus comprises the following components.

A roller conveyer is provided and configured with a plurality of rollers mounted on shafts for transferring the glass substrate.

There is at least a pair of directional beams arranged in parallel to the rollers, and in close contact with the rollers.

There is at least a pair of positioning device moveably assembled onto the directional beams, wherein each of the positioning devices is moveable along the corresponding beams, and wherein at least a portion of the positioning device extends to an upper surface of the rollers.

Wherein each of the positioning devices is interconnected with a piston so as to maneuver the positioning device to move along the beams.

There is a detecting device used to detect whether the glass substrate is offset from its intended route.

Wherein once the moving glass substrate is detected with an offset, the positioning device will be triggered so as to move along the beams so as to correct the offset bringing the glass substrate back to its correct position.

Wherein the positioning device comprises the following elements.

There is a pair of pushers each has at least a portion which extends to the upper surface of the roller.

Wherein each of the pushers is defined with an opening enveloping onto the transaxle.

There is a linkage having a crossbar interconnected to the pushers, and a rod interconnected to the piston of a cylinder such that the movement of the piston can move the pushers to move along the beams.

Wherein rollers are arranged in parallel to each other and are coplanarly for the movement of the glass substrate along the rollers Wherein the detecting device includes the following.

The detecting device includes a plurality of optoelectronic transmitters and receivers arranged along sides of a transferring surface, wherein the transmitters are arranged above or below the transferring surface, and the receiver is disposed on the opposite side.

Wherein the directional beams are arranged with limiter, setting the maximum displacement of the pusher along the beams, wherein the limiter abuts against an upper surface of the rollers.

Wherein the pushers are secured to the crossbar by means of dowel pins and its position on the crossbar can be readily adjusted.

Correspondingly, the present invention further provides a method for aligning a glass substrate, and includes the following steps.

There is a step of a) detecting whether there is an offset of a glass substrate transferred along a plurality of rollers by means of a detecting device.

There is a step of b) maneuvering a piston to displace a positioning device bringing the glass substrate back to its intended and correct position.

Wherein the step of detecting whether there is an offset of a glass substrate transferred along a plurality of rollers is conducted with the following step.

There is a step of c) detecting signals from a plurality of optoelectronic transmitters and receivers arranged along a transferring surface of the rollers, if a signal from one side is blocked, the determining there is an offset of the glass substrate.

Wherein the step of maneuvering a piston to displace a positioning device bringing the glass substrate back to its intended and correct position includes the following steps:

There is a step of d) displacing the piston located on the side in which the offset is detected to drive the positioning device toward a center of the rollers, wherein a portion of the positioning device extends over the surface of the rollers and move the glass substrate toward the center.

There is a step of e) wherein the positioning device will be stopped when it is in contact with a limiter so as to correctly move the glass substrate to the correct position.

Wherein further comprises the step of the following.

There is a step of f) retrieving the piston back to its original position after the glass substrate is correctly aligned.

The present invention can be concluded with the following advantages.

By the provision of the detecting device, a real-time detection of whether a glass substrate is offset from its intended position or not, and if an offset is found, then an alignment can be readily and immediately performed so as to make sure that the glass substrate can be safely transferred.

With the provision of the present invention, the defective rate of the glass substrate can be largely reduced.

Because the detection and the alignment are performed automatically, this can effectively increase the performance of the production, and the yield is increased.

In order to give a better and thorough understanding to the whole and other intended purposes, features and advantages of the technical solution of the present invention, detailed description will be given with respect to preferred embodiments provided and illustrated herebelow in accompanied drawings. Apparently, with the spirit of the embodiments disclosed, person in the skilled in the art can readily come out with other modifications as well as improvements without undue experiment. In addition, other drawings can be readily achieved based on the disclosed drawings.

DETAILED DESCRIPTION OF PREFERRED EMBODIMENT

Detailed description will be given along with the preferred embodiment accompanied with the drawings.

Figure 1:
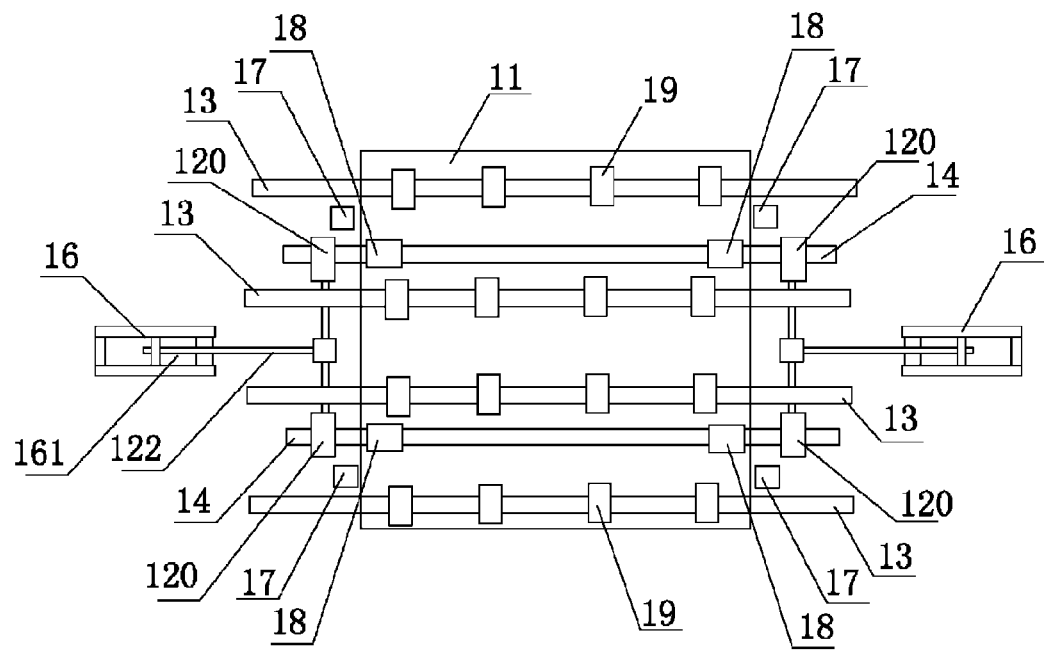
FIG. 1 is a top plan view of an alignment apparatus made in accordance with the present invention.
Figure 2:
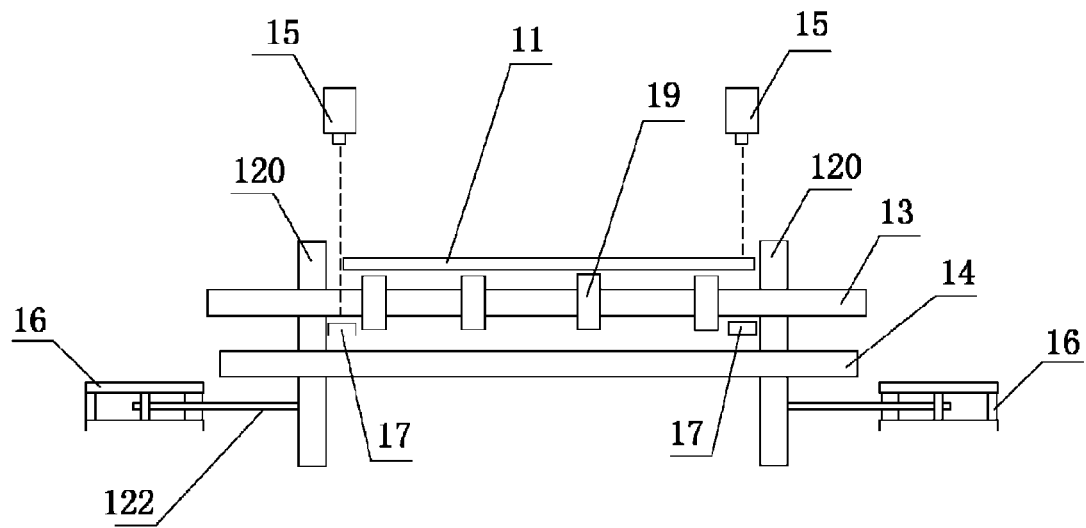
FIG. 2 is an end view of the alignment apparatus shown in FIG. 1.
Figure 3:
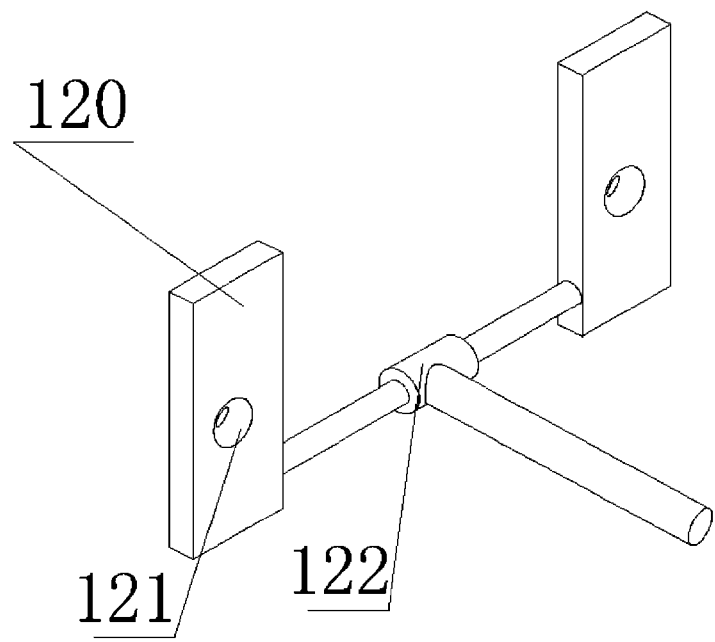
FIG. 3 is a perspective view of a positioning device of the alignment apparatus made in accordance with the present invention.

Referring to FIGS. 1 to 3, an aligning apparatus for correcting misalignment of a glass substrate during transportation along a conveyor is provided, and specially the conveyor is configured with rollers.

There is a roller conveyer is provided and configured with a plurality of rollers 19 mounted on shafts 13 for transferring the glass substrate 11. The rollers 19 are set such that there are coplanarly and the glass substrate 11 is displaced along the surface.

There is at least a pair of directional beams 14 arranged in parallel to the shafts 13, and in close contact with the rollers 13.

There is at least a pair of positioning devices 12 moveably assembled onto the directional beams 14 from both ends. Wherein each of the positioning devices 12 is moveable along the corresponding beams 14, and wherein at least a portion of the positioning device 12 extends to an upper surface of the rollers 19.

Wherein each of the positioning devices 12 is interconnected with a piston 16 so as to maneuver the positioning device 12 to move along the beams 14.

There is a detecting device used to detect whether the glass substrate 11 is offset from its intended route. Substantially, the detecting device includes a plurality of optoelectronic transmitters 15 and receivers 17 arranged along sides of a transferring surface, wherein the transmitters are arranged above or below the transferring surface, and the receiver is disposed on the opposite side. As shown in FIG. 2, the optoelectronic transmitters 15 are arranged on above the transferring surface used to transfer the glass substrate 11, while the receiver 17 is disposed below. It is understandable that the optoelectronic transmitter 15 can be arranged below the transferring surface, while the receiver 17 is disposed above the transferring surface. By verifying the signals transmitting and receiving between the transmitter 15 and the receiver 15, the glass substrate 11 can be readily determined whether there is an offset. For example, if the glass substrate 11 is offset to the right, then the path of light between the transmitter 15 and the receiver 17 is blocked, and a signal will be triggered so as to indicate that the glass substrate 11 has been shifted to the right, and a correction is needed.

Once the offset of the glass substrate 11 is detected, and then the piston 16 will start to drive the positioning device 12 to move. The positioning device 12 has a portion abutting the upper surface of the rollers 19, and then the portion will push the glass substrate 11 to move leftward so as to bring the glass substrate 11 back to its intended position.

Meanwhile, the directional beams 14 is provided with limiter 18 corresponding to the positioning device 12. The limiter 18 serves the marker of the maximum displacement of the positioning device 12 along the directional beams 14. An upper surface of the limiter 18 is lower than the upper surface of the positioning device 12. On the other hand, the limiter 18 is secured to the directional beams 14 with dowel pins, and the position thereon can be readily adjusted in view of the field requirements, such as different sizes and dimensions of the glass substrate 11.

Referring to FIG. 3, the positioning device 12 includes the following elements.

There is a pair of pushers 120 with at least a portion extending to the upper surface of the rollers 19.

Each of the pushers 120 defines an opening 121 through which the directional beam 14 passes through, and located on the end of the beam 14.

There is provided with a linkage having a cross bar 122 to interconnect the pushers 120, and the linkage includes a rod which is interconnected to the piston 161 of a cylinder 16. By the operation of the cylinder 16, the pusher 120 can move to and fro along the directional beams 14.

The present invention further provides a method for aligning a glass substrate during its transportation along a roller conveyor with the aligning apparatus disclosed from FIGS. 1 to 3. The steps of the aligning method will be construed and elaborated further.

Providing at least a detecting device mounted along a conveyor configured with a plurality of shafts with rollers assembled thereon to detect whether there is an offset of a glass substrate transferred therealong. The detecting device will detect signals from a plurality of optoelectronic transmitters and receivers arranged along a transferring surface of the rollers, if a signal from one side is blocked, the determining there is an offset of the glass substrate.

Once the glass substrate is detected with an offset, then a step of maneuvering a piston will be conducted to displace a positioning device bringing the glass substrate back to its intended and correct position includes the following steps of the following.

The cylinder on the side in which the transmitter and the receiver of which an offset is detected will be triggered to displace the piston to drive the positioning device toward a center of the rollers, wherein a portion of the positioning device extends over the surface of the rollers and move the glass substrate toward the center.

The positioning device will be stopped when it is in contact with a limiter so as to correctly move the glass substrate to the correct position.

Once the glass substrate is brought back to its correct position, the piston will be brought back to its original position after the glass substrate is correctly aligned.

It can be readily understood that the cylinder can be controlled with controller.

The present invention can be concluded with the following advantages.

By the provision of the detecting device, a real-time detection of whether a glass substrate is offset from its intended position or not, and if an offset is found, then an alignment can be readily and immediately performed so as to make sure that the glass substrate can be safely transferred.

With the provision of the present invention, the defective rate of the glass substrate can be largely reduced.

Because the detection and the alignment are performed automatically, this can effectively increase the performance of the production, and the yield is increased.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

The invention claimed is:

1. An aligning apparatus for aligning glass substrate, comprising
   a roller conveyer configured with a plurality of rollers mounted on shafts for transferring the glass substrate;
   at least a pair of directional beams arranged in parallel to the rollers, and in close contact with the rollers;
   at least a pair of positioning devices moveably assembled onto the directional beams, wherein each of the positioning devices is moveable along the corresponding beams, and wherein at least a portion of the positioning device extends to an upper surface of the rollers;
   each of the positioning devices being interconnected with a piston so as to maneuver the positioning device to move along the beams;
   a detecting device used to detect whether the glass substrate is offset from its intended route;
   wherein once the moving glass substrate is detected with an offset, the positioning device will be triggered so as to move along the beams so as to correct the offset bringing the glass substrate back to its correct position;
   wherein the positioning device comprises a pair of pushers each has at least a portion which extends to the upper surface of the roller; each of the pushers is defined with an opening enveloping onto a transaxle; a linkage having a crossbar interconnected to the pushers, and a rod interconnected to the piston of a cylinder such that the movement of the piston can move the pushers to move along the beams; and
   wherein the directional beams are arranged with limiter, setting the maximum displacement of the pusher along the beams, wherein the limiter abuts against an upper surface of the rollers.

2. The alignment apparatus as recited in claim 1, wherein the detecting device includes a plurality of optoelectronic transmitters and receivers arranged along sides of a transferring surface, wherein the transmitters are arranged above or below the transferring surface, and the receiver is disposed on the opposite side.

3. The alignment apparatus as recited in claim 1, wherein the pushers are secured to the crossbar by means of dowel pins and its position on the crossbar can be readily adjusted.

4. The alignment apparatus as recited in claim 3, wherein rollers are arranged in parallel to each other and are coplanarly for the movement of the glass substrate along the rollers.

5. An aligning apparatus for aligning glass substrate, comprising
   a roller conveyer configured with a plurality of rollers mounted on shafts for transferring the glass substrate;
   at least a pair of directional beams arranged in parallel to the rollers, and in close contact with the rollers;
   at least a pair of positioning devices moveably assembled onto the directional beams, wherein each of the positioning devices is moveable along the corresponding beams, and wherein at least a portion of the positioning device extends to an upper surface of the rollers;
   each of the positioning devices being interconnected with a piston so as to maneuver the positioning device to move along the beams;
   a detecting device used to detect whether the glass substrate is offset from its intended route, wherein the detecting device includes a plurality of optoelectronic transmitters and receivers arranged along sides of a transferring surface, wherein the transmitters are arranged above or below the transferring surface, and the receiver is disposed on the opposite side;
   wherein once the moving glass substrate is detected with an offset, the positioning device will be triggered so as to move along the beams so as to correct the offset bringing the glass substrate back to its correct position;
   wherein the positioning device comprises a pair of pushers each has at least a portion which extends to the upper surface of the roller; each of the pushers is defined with an opening enveloping onto a transaxle; a linkage having a crossbar interconnected to the pushers, and a rod interconnected to the piston of a cylinder such that the movement of the piston can move the pushers to move along the beams; and
   wherein the directional beams are arranged with limiter, setting the maximum displacement of the pusher along the beams, wherein the limiter abuts against an upper surface of the rollers.

6. The alignment apparatus as recited in claim 5, wherein the pushers are secured to the crossbar by means of dowel pins and its position on the crossbar can be readily adjusted.

7. The alignment apparatus as recited in claim 6, wherein rollers are arranged in parallel to each other and are coplanarly for the movement of the glass substrate along the rollers.

8. A method for aligning glass substrate, comprising the steps of:
   a) detecting whether there is an offset of a glass substrate transferred along a plurality of rollers by means of a detecting device; and
   b) maneuvering a piston to displace a positioning device bringing the glass substrate back to its intended and correct position;
   wherein the step of detecting whether there is an offset of a glass substrate transferred along a plurality of rollers is conducted with the following step:
   c) detecting signals from a plurality of optoelectronic transmitters and receivers arranged along a transferring surface of the rollers, if a signal from one side is blocked, the determining there is an offset of the glass substrate; and
   wherein the step of maneuvering a piston to displace a positioning device bringing the glass substrate back to its intended and correct position includes the following steps:
   d) displacing the piston located on the side in which the offset is detected to drive the positioning device toward a center of the rollers, wherein a portion of the positioning device extends over the surface of the rollers and moves the glass substrate toward the center; and
   e) wherein the positioning device will be stopped when it is in contact with a limiter so as to correctly move the glass substrate to the correct position.

9. The method as recited in claim 8, wherein further comprises the step of:
   f) retrieving the piston back to its original position after the glass substrate is correctly aligned.

* * * * *